US009753098B2

(12) United States Patent
Latham

(10) Patent No.: US 9,753,098 B2
(45) Date of Patent: Sep. 5, 2017

(54) MAGNETIC SENSOR HAVING ENHANCED LINEARIZATION BY APPLIED FIELD ANGLE ROTATION

(71) Applicant: ALLEGRO MICROSYSTEMS, LLC, Worcester, MA (US)

(72) Inventor: Alexander Latham, Harvard, MA (US)

(73) Assignee: ALLEGRO MICROSYSTEMS, LLC, Worcester, MA (US)

( * ) Notice: Subject to any disclaimer, the term of this patent is extended or adjusted under 35 U.S.C. 154(b) by 0 days.

(21) Appl. No.: 15/263,842

(22) Filed: Sep. 13, 2016

(65) Prior Publication Data

US 2017/0038437 A1    Feb. 9, 2017

Related U.S. Application Data

(63) Continuation of application No. 14/820,969, filed on Aug. 7, 2015, now Pat. No. 9,470,765.

(51) Int. Cl.
    *G11B 5/39*  (2006.01)
    *G01R 33/00* (2006.01)
    *G01R 33/09* (2006.01)

(52) U.S. Cl.
    CPC ....... *G01R 33/0082* (2013.01); *G01R 33/093* (2013.01)

(58) Field of Classification Search
    None
    See application file for complete search history.

(56) References Cited

U.S. PATENT DOCUMENTS

| 4,385,283 | A  | * | 5/1983  | Delapierre ............ B60Q 11/00 324/503 |
| 5,796,249 | A  | * | 8/1998  | Andra .................... G01D 5/145 324/174 |
| 6,538,437 | B2 | * | 3/2003  | Spitzer ................... B82Y 25/00 324/249 |
| 6,995,315 | B2 |   | 2/2006  | Sharma et al. |
| 7,075,287 | B1 |   | 7/2006  | Mangtani et al. |
| 7,166,807 | B2 |   | 1/2007  | Gagnon et al. |
| 7,259,545 | B2 |   | 8/2007  | Stauth et al. |
| 7,476,816 | B2 |   | 1/2009  | Doogue et al. |
| 7,518,354 | B2 |   | 4/2009  | Stauth et al. |
| 7,598,601 | B2 |   | 10/2009 | Taylor et al. |

(Continued)

FOREIGN PATENT DOCUMENTS

JP    62-048057 A    3/1987

OTHER PUBLICATIONS

U.S. Appl. No. 14/820,969, filed Aug. 7, 2015, Latham.

(Continued)

*Primary Examiner* — Will J Klimowicz
(74) *Attorney, Agent, or Firm* — Daly, Crowley Mofford & Durkee, LLP

(57) ABSTRACT

Method and apparatus for a current sensing device including a magnetoresistive magnetic field sensing element positioned with respect to a shaped conductor such that an applied field generated by current through the shaped conductor forms an offset angle theta defined by the applied field and a field of a pinning layer of the magnetoresistive element. The offset angle increases a linearity of the device output for current in the shaped conductor flowing in a first direction. A further sensor can increase linearity in the opposite direction.

34 Claims, 12 Drawing Sheets

(56) References Cited

U.S. PATENT DOCUMENTS

| | | | |
|---|---|---|---|
| 7,709,754 B2 | 5/2010 | Doogue et al. | |
| 7,746,056 B2 | 6/2010 | Stauth et al. | |
| 7,973,527 B2 | 7/2011 | Taylor et al. | |
| 8,080,994 B2 | 12/2011 | Taylor et al. | |
| 9,470,765 B1 * | 10/2016 | Latham | G01R 33/093 |
| 2009/0243607 A1 | 10/2009 | Mather et al. | |
| 2010/0276389 A1 | 11/2010 | Mather et al. | |
| 2012/0049843 A1 | 3/2012 | Sun et al. | |
| 2012/0161756 A1 | 6/2012 | Paci et al. | |
| 2012/0193736 A1 | 8/2012 | Mather et al. | |
| 2012/0212217 A1 | 8/2012 | Engel et al. | |
| 2013/0106410 A1 | 5/2013 | Liu et al. | |
| 2015/0323568 A1 * | 11/2015 | Schmitt | G01R 15/207 |
| | | | 324/126 |
| 2015/0362564 A1 | 12/2015 | Wan et al. | |

OTHER PUBLICATIONS

U.S. Appl. No. 14/820,969 Restriction Requirement dated Dec. 16, 2015, 9 pages.

U.S. Appl. No. 14/820,969 Response to Restriction Requirement filed Dec. 22, 2015, 3 pages.

U.S. Appl. No. 14/820,969 Office Action dated Feb. 11, 2016, 15 pages.

U.S. Appl. No. 14/820,969 Response to Office Action filed May 10, 2016, 8 pages.

U.S. Appl. No. 14/820,969 Notice of Allowance dated Jun. 15, 2016, 9 pages.

* cited by examiner

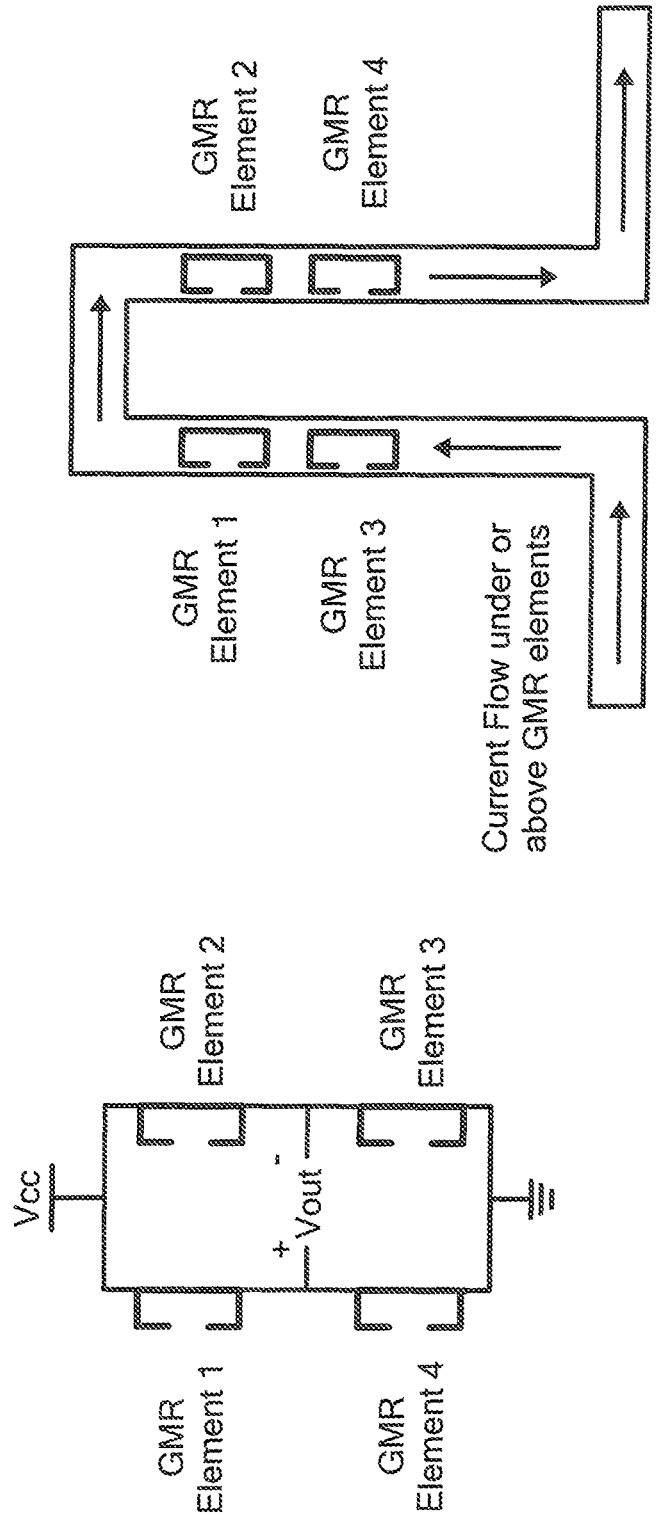

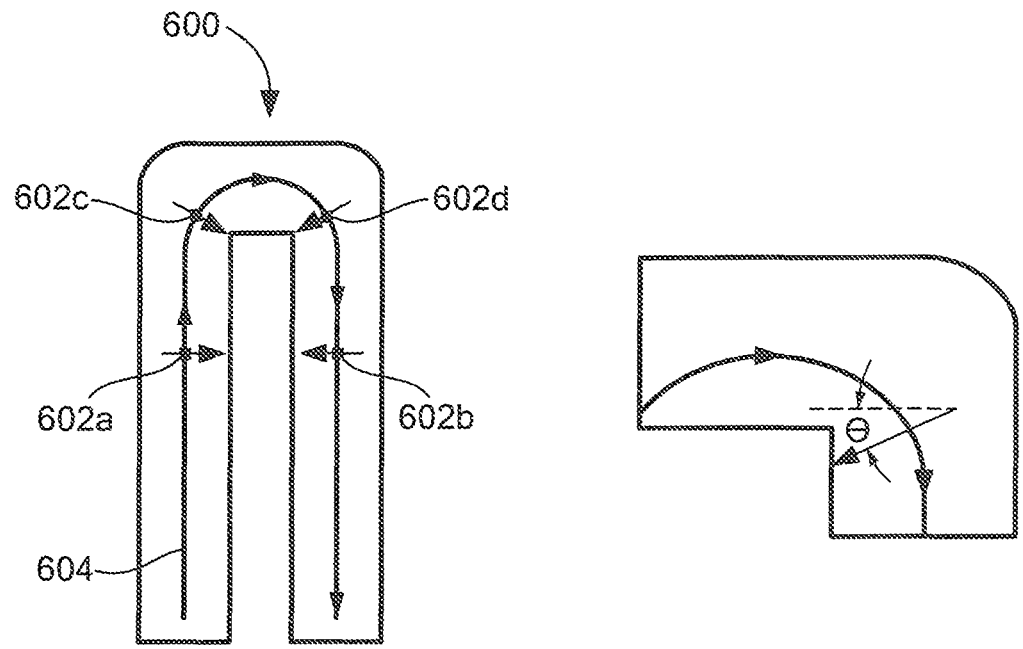
FIG. 6A
FIG. 6B
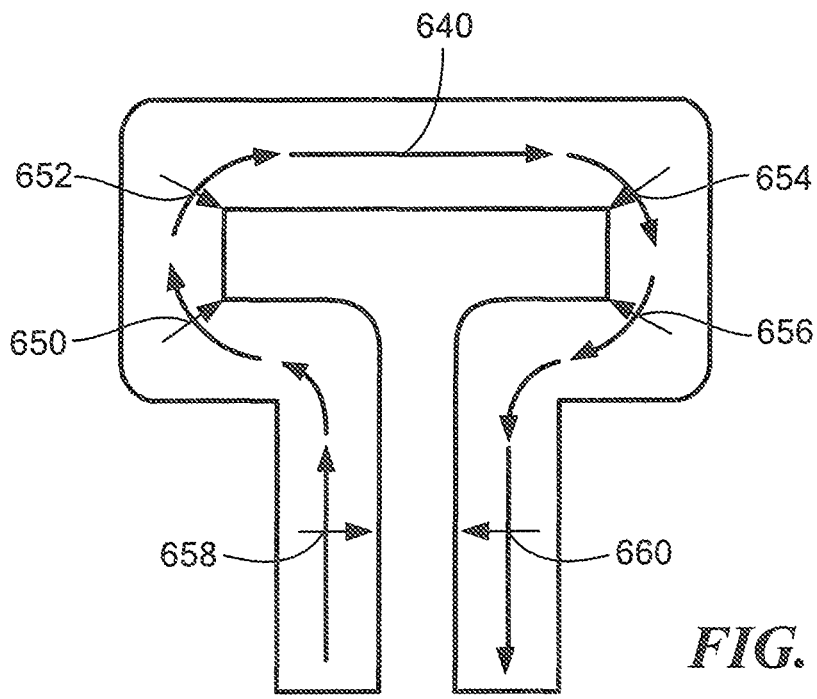
FIG. 6C

MAGNETIC SENSOR HAVING ENHANCED LINEARIZATION BY APPLIED FIELD ANGLE ROTATION

CROSS REFERENCE TO RELATED APPLICATIONS

This application is a continuation of U.S. patent application Ser. No. 14/820,969 filed on Aug. 7, 2015, entitled: "Magnetic Sensor Having Enhanced Linearization by Applied Field Angle Rotation" which is incorporated herein by reference in its entirety.

BACKGROUND

Magnetic sensors are widely used in modern systems to measure or detect physical parameters, such as magnetic field strength, current, position, motion, orientation, and so forth. There are many different types of sensors for measuring magnetic fields and other parameters. However, such sensors suffer from various limitations, for example, excessive size, inadequate sensitivity and/or dynamic range, cost, reliability and the like.

SUMMARY

In embodiments of the invention, a sensor includes a GMR element or set of elements for sensing linear magnetic fields. When using GMR as a linear sensor, a response is generated corresponding to the sine of the arctangent of the applied linear field. The output is linear over a limited range of field around zero. In embodiments of the invention, a linear response is generated over a wider range of applied field than in conventional GMR devices by applying the sensed field at an angle to the strongly pinned layer of the GMR. The saturating effect of the sine and arctangent is partially compensated for by an increase in sensitivity as the field increases. It is understood that the compensation may work in one direction while making the non-linearity worse in the opposite direction. In embodiments, bidirectional sensing is achieved by switching between multiple sensors based upon the direction of the field being sensed at a given time.

Embodiments of the invention enhance the linearity of our unidirectional current sensors. In some embodiments, a higher current can be sensed than in bidirectional embodiments by changing the position of the GMR elements. In embodiments, multiple GMR elements are located on a die and can be selected based on whether an application is unidirectional or bidirectional in nature.

In one aspect of the invention, a device comprises: a first magnetoresistive magnetic field sensing element positioned with respect to a shaped conductor such that an applied field generated by current through the shaped conductor forms an offset angle theta defined by the applied field and a field of a pinning layer of the first magnetoresistive magnetic field element, wherein the offset angle theta is greater than about five degrees to increase a linearity of an output of the first magnetoresistive magnetic field sensing element for current in the shaped conductor flowing in a first direction; and an output module to receive the linearized signal from the linearization module and provide a device output signal.

The device can further include one or more of the following features: the first magnetoresistive magnetic field sensing element comprises a GMR element, the GMR element comprises a pinned layer providing a reference field substantially perpendicular to the field of the first pinned layer, the first magnetoresistive magnetic field sensing element comprises a magnetoresistive element selected from a group consisting of a semiconductor magnetoresistive element, a giant magnetoresistive (GMR) element, an anisotropic magnetoresistive element (AMR), a tunneling magnetoresistive (TMR) element, and a magnetic tunnel junction (MTJ), the first magnetoresistive magnetic field sensing element comprises magnetic sensors arranged in a Wheatstone bridge configuration, first and second ones of the magnetic sensors are magnetically shielded for linear field sensing, a supply voltage controls a gain of the magnetic field sensing element over temperature, the shaped conductor comprises an arcuate portion coupled at each end to respective linear portions, the first magnetoresistive magnetic field sensing element comprises a GMR having elements in a bridge configuration such that the elements in the bridge configuration are positioned on the arcuate portion of the shaped conductor, wherein a direction of current flow in the shaped conductor is determined in the bridge configuration, a second magnetoresistive magnetic field sensing element to increase linearity of the output for current flow in the shaped conductor in the opposite direction, the applied angle for the second magnetoresistive magnetic field sensing element is about equal to 180 minus theta, where theta is the applied angle for the first magnetoresistive magnetic field sensing element, and/or the first magnetoresistive magnetic field sensing element has a die orientation 180 degrees to the second magnetoresistive magnetic field sensing element.

In another aspect of the invention, a device comprises: a first magnetic field sensor means for sensing current in a shaped conductor at an offset angle theta defined by the applied field and a field of a pinning layer of the magnetoresistive element, wherein the offset angle theta is greater than about five degrees to increase a linearity of an output of the magnetoresistive magnetic field sensing element for current in the shaped conductor flowing in a first direction; and an output module to receive the linearized signal from the linearization module and provide a device output signal.

The device can further include one or more of the following features: the first magnetic field sensor comprises a GMR element, the GMR element comprises a pinned layer providing a reference field substantially perpendicular to the field of the first pinned layer, the first magnetic field sensor means comprises a magnetoresistive element selected from a group consisting of a semiconductor magnetoresistive element, a giant magnetoresistive (GMR) element, an anisotropic magnetoresistive element (AMR), a tunneling magnetoresistive (TMR) element, and a magnetic tunnel junction (MTJ), the first magnetic field sensor means comprises magnetic sensors arranged in a Wheatstone bridge configuration, first and second ones of the magnetic sensors are magnetically shielded for linear field sensing, a supply voltage controls a gain of the first magnetic field sensor means over temperature, the shaped conductor comprises an arcuate portion coupled at each end to respective linear portions, the first magnetic field sensor means comprises a GMR having elements in a bridge configuration such that the elements in the bridge configuration are positioned on the arcuate portion of the shaped conductor, wherein a direction of current flow in the shaped conductor is determined in the bridge configuration, a second magnetic field sensor means element to increase linearity of the output for current flow in the shaped conductor in the opposite direction, the applied angle for the second magnetic field sensor means is about equal to 180 minus theta, where theta is the applied angle for the first magnetic field sensor means, and/or the first magnetic field sensor means has a die orientation 180 degrees to the second magnetic field sensor means.

In a further aspect of the invention, a method comprises: positioning a first magnetoresistive magnetic field sensing element with respect to a shaped conductor such that an applied field generated by current through the shaped conductor forms an offset angle theta defined by the applied field and a field of a pinning layer of the first magnetoresistive magnetic field sensing element, wherein the offset angle theta is greater than about five degrees to increase a linearity of an output of the first magnetoresistive magnetic field sensing element for current in the shaped conductor flowing in a first direction; and employing an output module to receive the linearized signal from the linearization module and provide a device output signal.

The method can further include one or more of the following features: the first magnetoresistive magnetic field sensing element comprises a GMR element, the GMR element comprises a pinned layer providing a reference field substantially perpendicular to the field of the first pinned layer, the first magnetoresistive magnetic field sensing element comprises a magnetoresistive element selected from a group consisting of a semiconductor magnetoresistive element, a giant magnetoresistive (GMR) element, an anisotropic magnetoresistive element (AMR), a tunneling magnetoresistive (TMR) element, and a magnetic tunnel junction (MTJ), the first magnetoresistive magnetic field sensing element comprises magnetic sensors arranged in a Wheatstone bridge configuration, first and second ones of the magnetic sensors are magnetically shielded for linear field sensing, a supply voltage controls a gain of the magnetic field sensing element over temperature, the shaped conductor comprises an arcuate portion coupled at each end to respective linear portions, the first magnetoresistive magnetic field sensing element comprises a GMR having elements in a bridge configuration such that the elements in the bridge configuration are positioned on the arcuate portion of the shaped conductor, wherein a direction of current flow in the shaped conductor is determined in the bridge configuration, a second magnetoresistive magnetic field sensing element to increase linearity of the output for current flow in the shaped conductor in the opposite direction, the applied angle for the second magnetoresistive magnetic field sensing element is about equal to 180 minus theta, where theta is the applied angle for the first magnetoresistive magnetic field sensing element, and/or the first magnetoresistive magnetic field sensing element has a die orientation 180 degrees to the second magnetoresistive magnetic field sensing element.

BRIEF DESCRIPTION OF THE DRAWINGS

FIGS. 1B and 1C are schematic representations of current sensing for the circuit of FIG. 1;

FIG. 6A is a schematic representation of a portion of a current sensor including a current conductor having a sensor with an offset angle applied field;

FIG. 6B shows further detail of the offset angle of FIG. 6A;

FIG. 6C shows a schematic representation of a portion of a current sensor with multiple sensors having offset angles to provide bi-directional enhanced linearity;

DETAILED DESCRIPTION

As used herein, the term "magnetic field sensing element" is used to describe a variety of electronic elements that can sense a magnetic field. The magnetic field sensing element can comprise, but is not limited to, a Hall Effect element, a magnetoresistance element, and/or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, a magnetic tunnel junction (MTJ), and a spin-valve. The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

Figure 1:
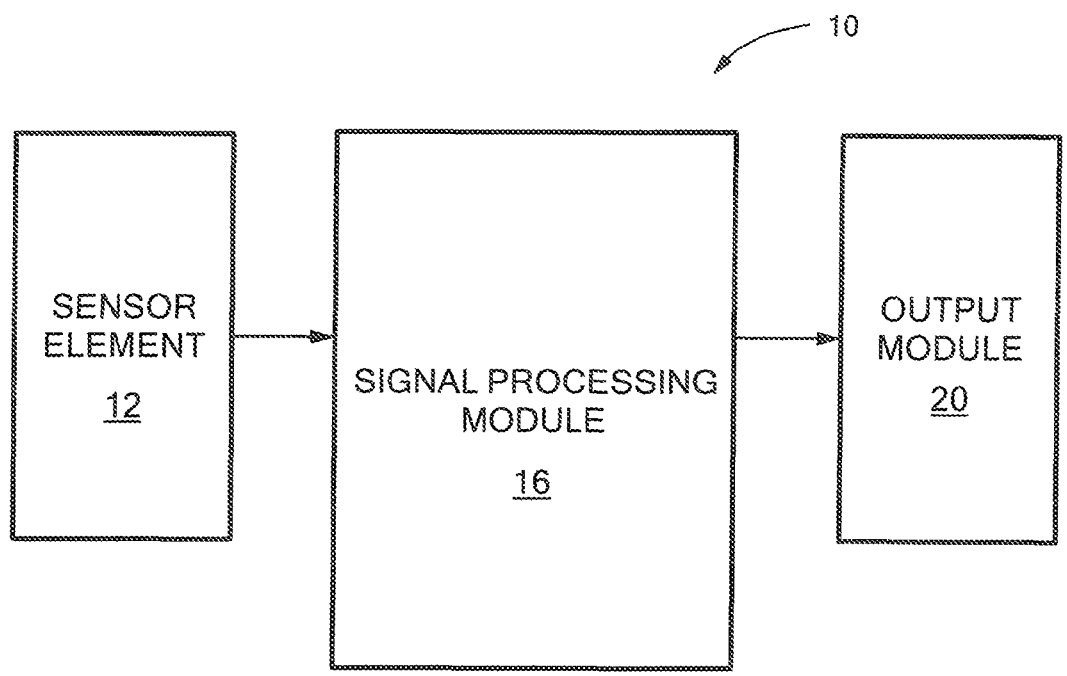
FIG. 1 is a schematic representation of an illustrative magnetic sensor circuit according to an embodiment.

FIG. 1 is a circuit diagram illustrating an example of a magnetic field sensor 10 including a magnetic field sensing element 12 having enhanced linearity in accordance with illustrative embodiments of the invention. The magnetic field sensing element 12 senses changes in a magnetic field. In embodiments, the magnetic field sensor 10 senses field changes from current through a conductor. A signal processing module 16 is coupled to the magnetic field sensing element 12 to process the signal from the sensing element. In an illustrative embodiment, the sensor element 12 is positioned to provide an offset angle for the applied magnetic field to enhance output voltage linearity, as described more fully below. An output module 20 is coupled to the signal processing module 16 to provide an output signal for a device containing the magnetic field sensor.

Figure 1A:
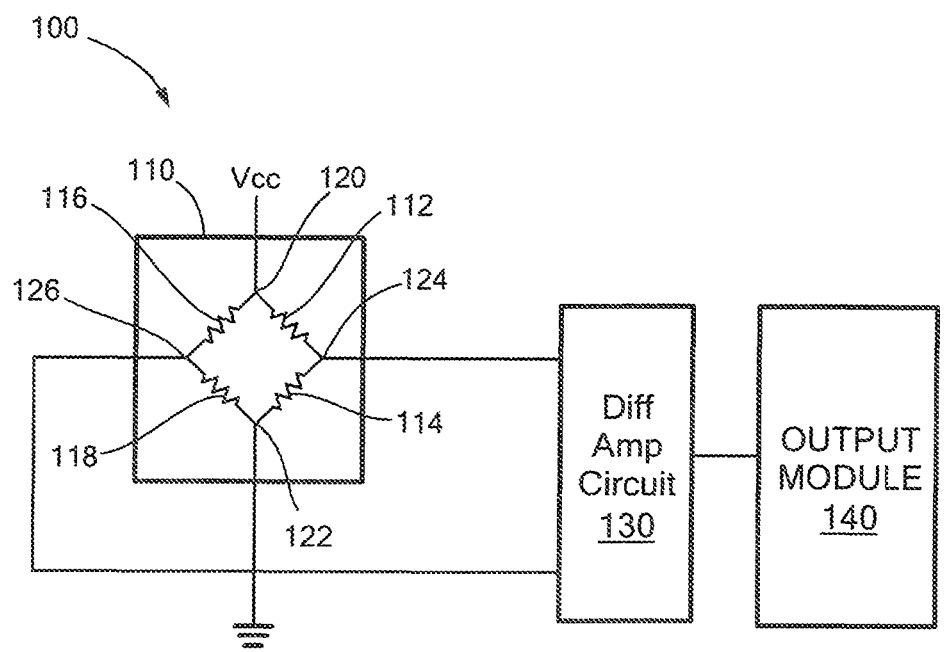
FIG. 1A is a schematic representation showing further detail of the circuit according to FIG. 1.

In one embodiment shown in FIG. 1A, the magnetic field sensing element 12 of FIG. 1 is provided as a magnetoresistive element 110, such as a GMR element, in the form of a Wheatstone bridge as part of a magnetic field sensor 100. The Wheatstone bridge circuit 110 includes magnetic field sensing elements, such as GMR elements 112, 114, 116, 118, disposed on the respective branches of the bridge 110.

In the illustrative embodiment, one end of the GMR element 112 and one end of the GMR element 116 are connected in common to a power supply terminal V via a node 120, one end of the GMR element 114 and one end of the GMR element 118 are connected in common to ground via a node 122. The other end of the GMR element 112 and the other end of the GMR element 114 are connected to a node 124, and the other end of the GMR element 116 and the other end of the GMR element 118 are connected to a node 126.

Node 124 of the Wheatstone bridge circuit 110 is connected to a differential amplifier circuit 130. Node 126 is also connected to the differential amplifier circuit 130. A first output of the differential amplifier circuit 130 is connected to an output module 140. In embodiments, Vcc can be used to compensate for gain changes of the GMR elements over process and temperature. It is understood that the differential amplifier circuit 130 can include offset trim to correct for GMR sensor mismatch.

The magnetic field sensing planes of the GMR elements 112, 116 and 114, 118 react to changes in a magnetic field by corresponding resistances changes. GMR elements 112, 118 have maximum and minimum resistances at locations opposite in phase to that of GMR elements 114, 116. This is due to either how the magnetics of the system are set up or different pinning orientations of the elements. As a result, the voltages at the nodes 124, 126 (mid-point voltages) of the Wheatstone bridge circuit 110 also change in a similar fashion.

Magnetoresistance refers to the dependence of the electrical resistance of a sample on the strength of external magnetic field characterized as:

$$\delta_H = \frac{R(0) - R(H)}{R(H)},$$

where R(H) is the resistance of the sample in a magnetic field H, and R(0) corresponds to H=0. The term "giant magnetoresistance" indicates that the value $\delta_H$ for multilayer structures significantly exceeds the anisotropic magnetoresistance, which has a typical value within a few percent.

Giant magnetoresistance (GMR) is a quantum mechanical magnetoresistance effect observed in thin-film structures composed of alternating ferromagnetic and non-magnetic conductive layers. The effect is observed as a significant change in the electrical resistance depending on whether the magnetization of adjacent ferromagnetic layers is in a parallel or an antiparallel alignment. The overall resistance is relatively low for parallel alignment and relatively high for antiparallel alignment. The magnetization direction can be controlled, for example, by applying an external magnetic field. The effect is based on the dependence of electron scattering on the spin orientation. A Wheatstone bridge of four identical GMR devices is insensitive to a uniform magnetic field and is reactive when the field directions are antiparallel in the neighboring arms of the bridge.

Figure 1D:
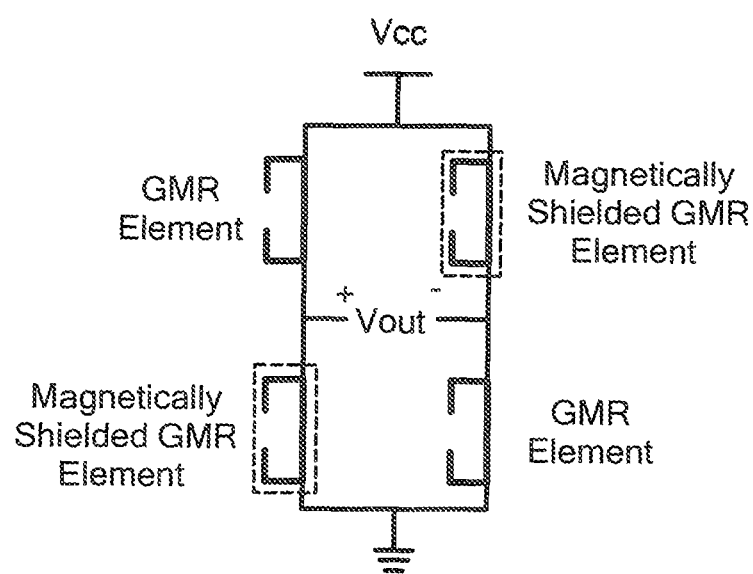
FIG. 1D is a schematic representation of linear sensing for the circuit of FIG. 1.

FIG. 1B shows a circuit having bridge-coupled GMR elements and FIG. 1C shows current flow under or above the GMR elements for a current sensing implementation, where two of the resistors see field in one direction due to the current flow, and the other two see field in the opposite direction due to the current flow. FIG. 1D shows a circuit for linear sensing of an applied field with two of the GMR elements magnetically shielded.

Figure 1E:
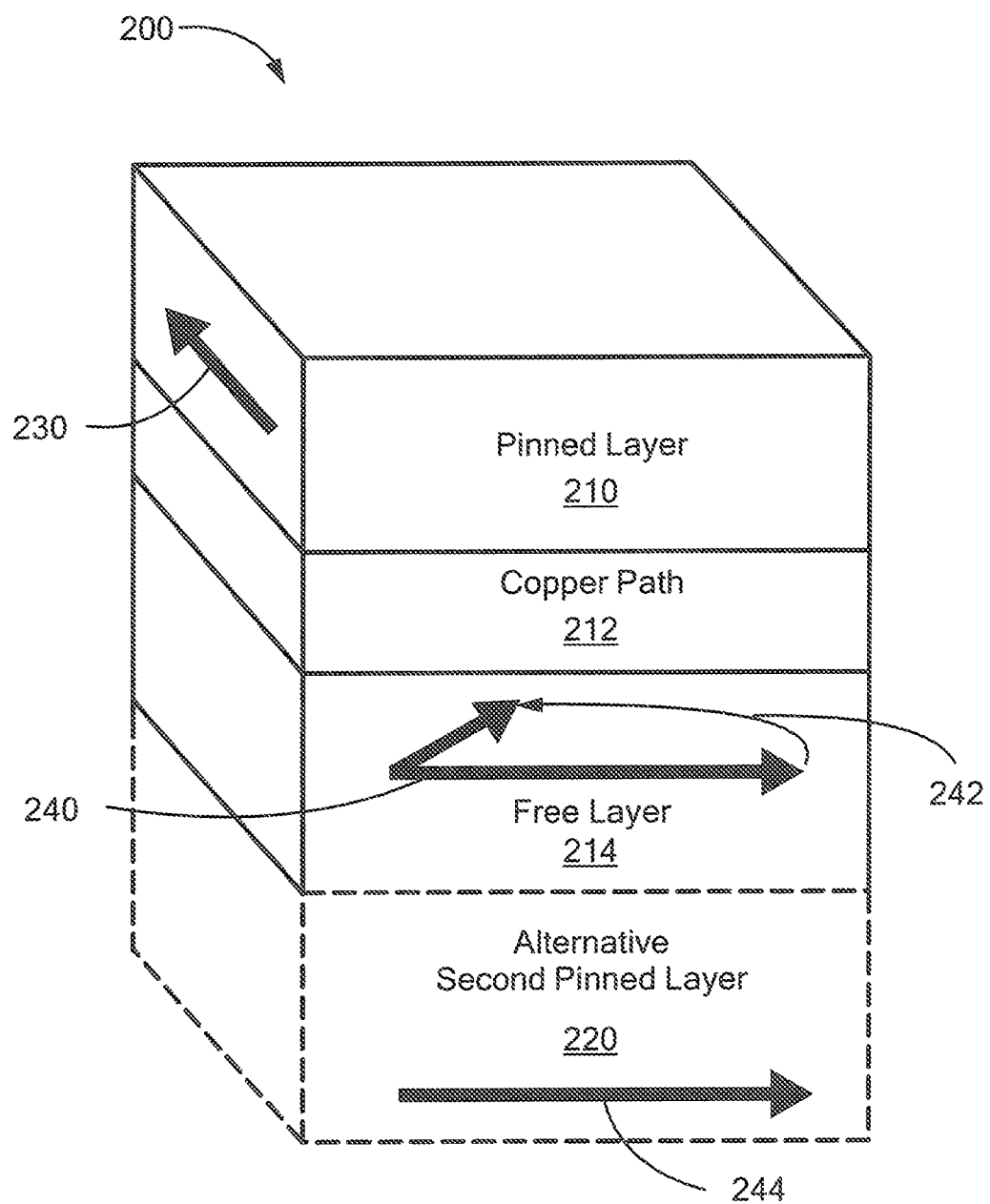
FIG. 1E is a schematic representation of GMR layers.

FIG. 1E illustrates a simplified GMR sensor 200 that can form a part of the magnetic field sensor 10 of FIG. 1 according to an embodiment. In FIG. 1E, the GMR sensor 200 includes a pinned layer 210, a metal path 212, such as copper, and a free layer 214. The magnetic orientation of the pinned layer 210 is fixed. The magnetic orientation of the free layer 214 is maintained in a selected alignment through anisotropy or by the shown alternative second pinned layer 220, each of which provide a pinning field. The magnetic orientation of the free layer 214 rotates 242 based on the applied field.

Figure 2:
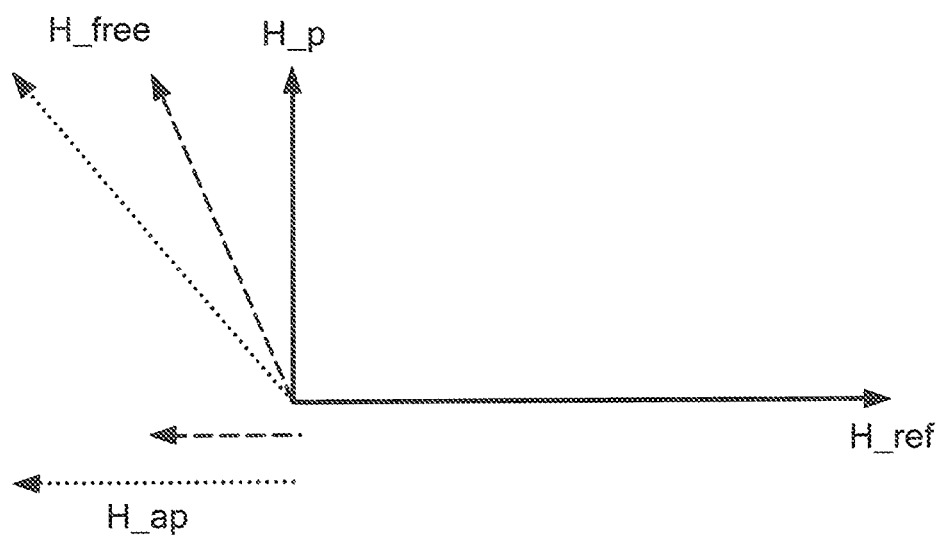
FIG. 2 is a representation of a prior art GMR sensor field orientations.

FIG. 2 shows a conventional configuration for linear sensor including a GMR element having a reference pinned layer field $H_{ref}$ and a secondary pinned layer field $H_p$ (or the strength of the residual magnetic field due to shape anisotropy). In the presence of an applied magnetic field $H_{ap}$, a free layer $H_{free}$ orients itself as a sum of the $H_p$ and $H_{ap}$ vectors. With no applied field present, $H_{free}$ lines up with $H_p$. As can be seen, as $H_{ap}$ increases, $H_{free}$ changes in angle.

The resistance of the GMR element is proportional to the sine of the angle between $H_{free}$ and $H_f$ so that the output of the sensor, which can be provided in a Wheatstone bridge for example, is defined as:

$$V_{OUT} \propto \sin\left(\tan^{-1}\left(\frac{H_{ap}}{H_p}\right)\right)$$

Figure 3A:
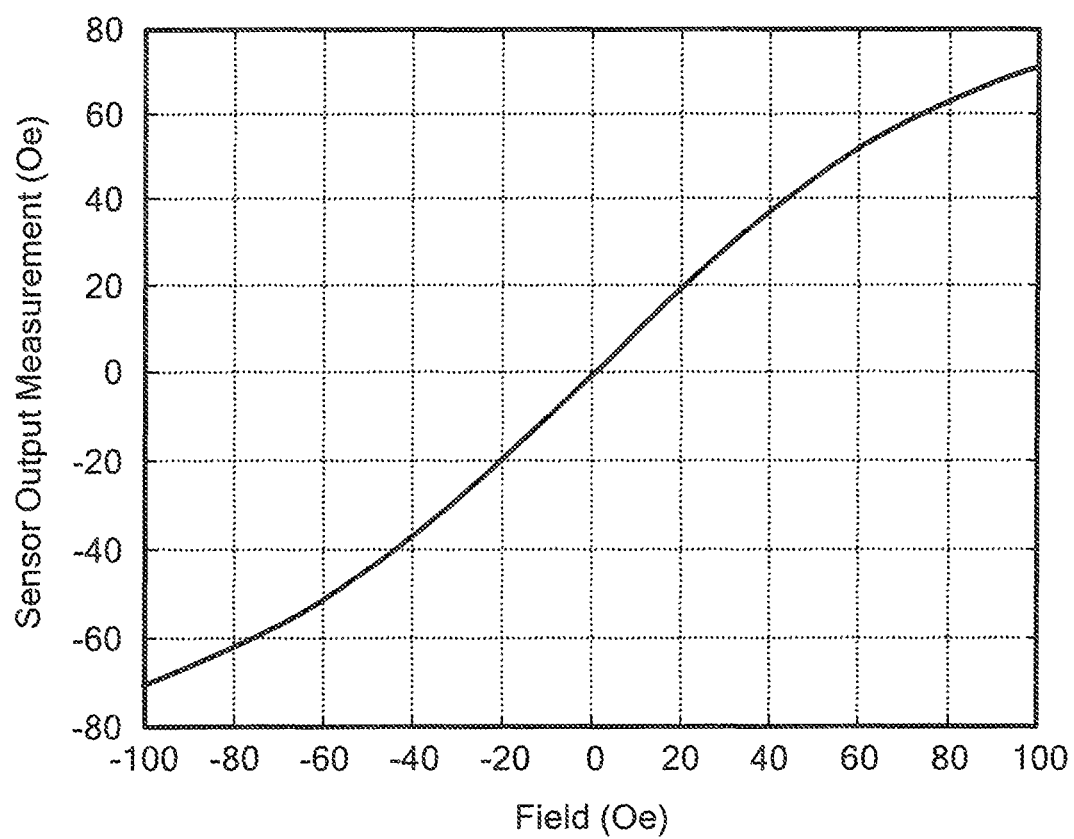
FIG. 3A shows a curve representing a sensor output voltage $V_o$ corresponding to the sine of the free layer angle versus the applied field and scaled to give measured field according to the prior art.
Figure 3B:
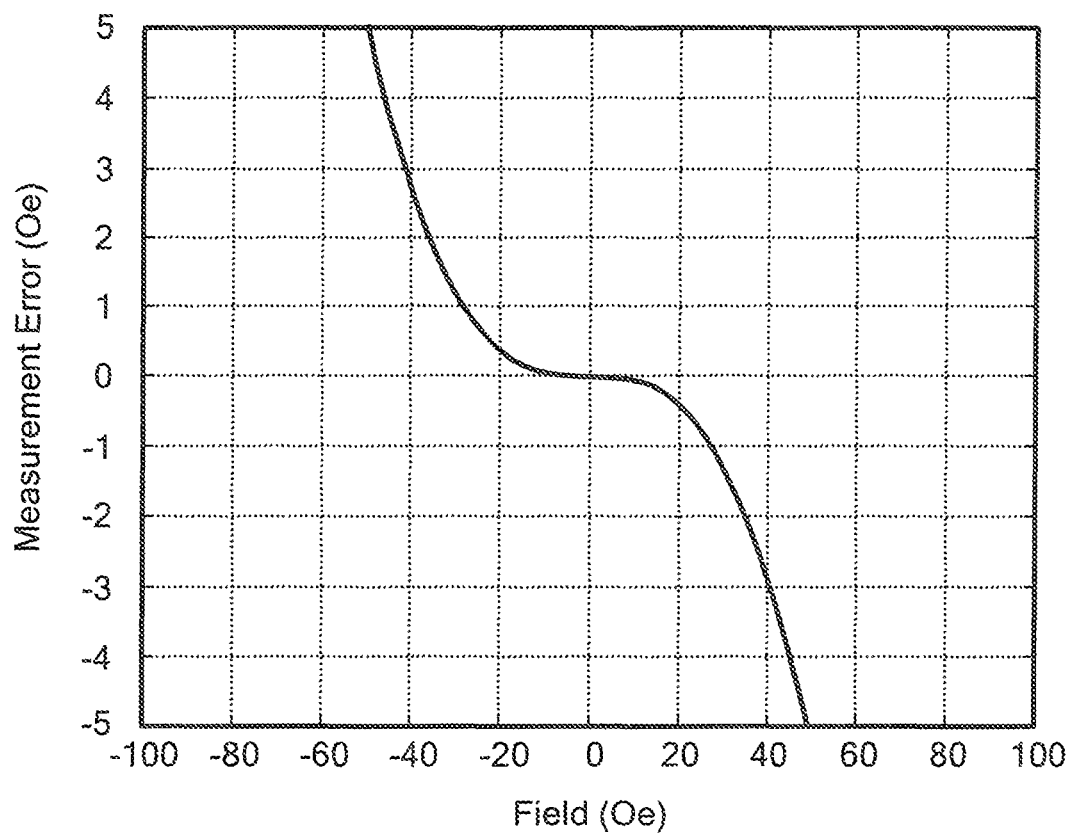
FIG. 3B shows a curve representing a sensor output voltage $V_o$ as the error from an ideal sensor versus the applied field according to the prior art.

FIG. 3A shows for the configuration of FIG. 2, used in the bridge configuration of FIG. 1D, the resulting output versus $H_{ap}$ for $H_p$=100 Oe. FIG. 3B shows the error in the sensor output from the ideal linear output in Oe. If one wants to maintain an error of less than 1 Oe or better, the maximum field is around 25 Oe, which is one quarter of the second pinning layer or anisotropy strength.

Figure 4A:
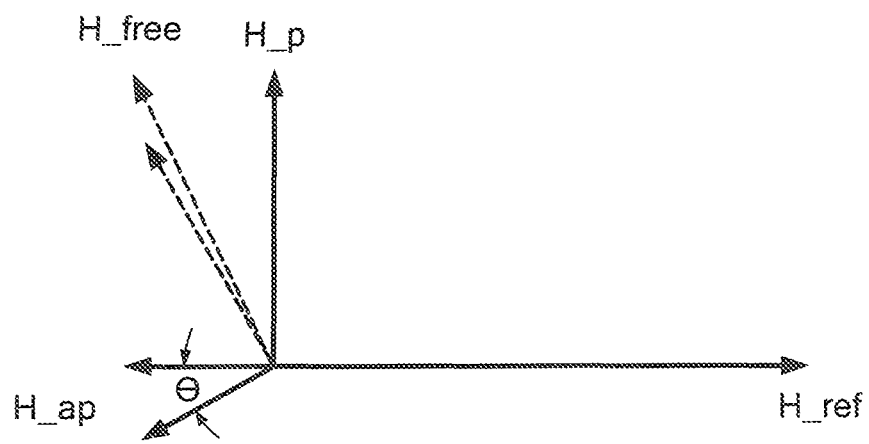
FIGS. 4A,B are representations of an offset applied angle for a sensor in accordance with embodiments of the invention.

In embodiments of the invention, the offset angle θ of the applied field $H_{ap}$ is modified to adjust the nonlinearity. For example, if one changes the applied field as shown in FIGS. 4A,B, the applied field effectively reduces $H_p$ as the applied field increases. This results in an increased sensitivity as the applied field $H_{ap}$ increases, counteracting the nonlinearity of the sine and arctangent. The modified output can be described as:

$$V_{OUT} \propto \sin\left(\tan^{-1}\left(\frac{H_{ap}\cos\theta}{H_p - H_{ap}\sin\theta}\right)\right)$$

Figure 5A:
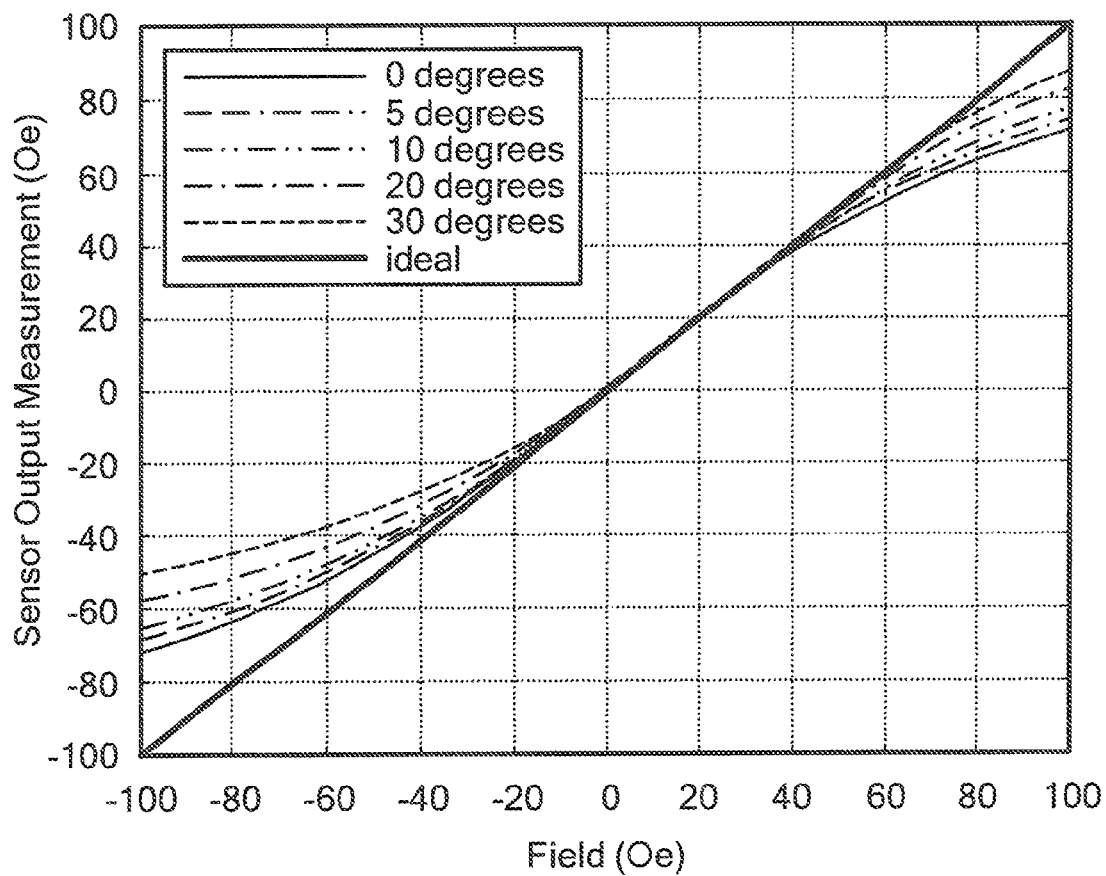
FIG. 5A is a graphical representation of sensor output voltage $V_o$ corresponding to the sine of the free layer angle versus the applied field and scaled to give measured field with enhanced linearization in one direction in accordance with embodiments of the invention.

As the angle increases from zero, the response curve changes as shown in FIG. 5A. As the angle increases, the response becomes more linear in one direction, though it does eventually overshoot the ideal curve. As can be seen, linearity increases at the top right of the curve. As will be appreciated, it is desirable to tune the angle to stay within a desired error over a widest range of input field.

Figure 5B:
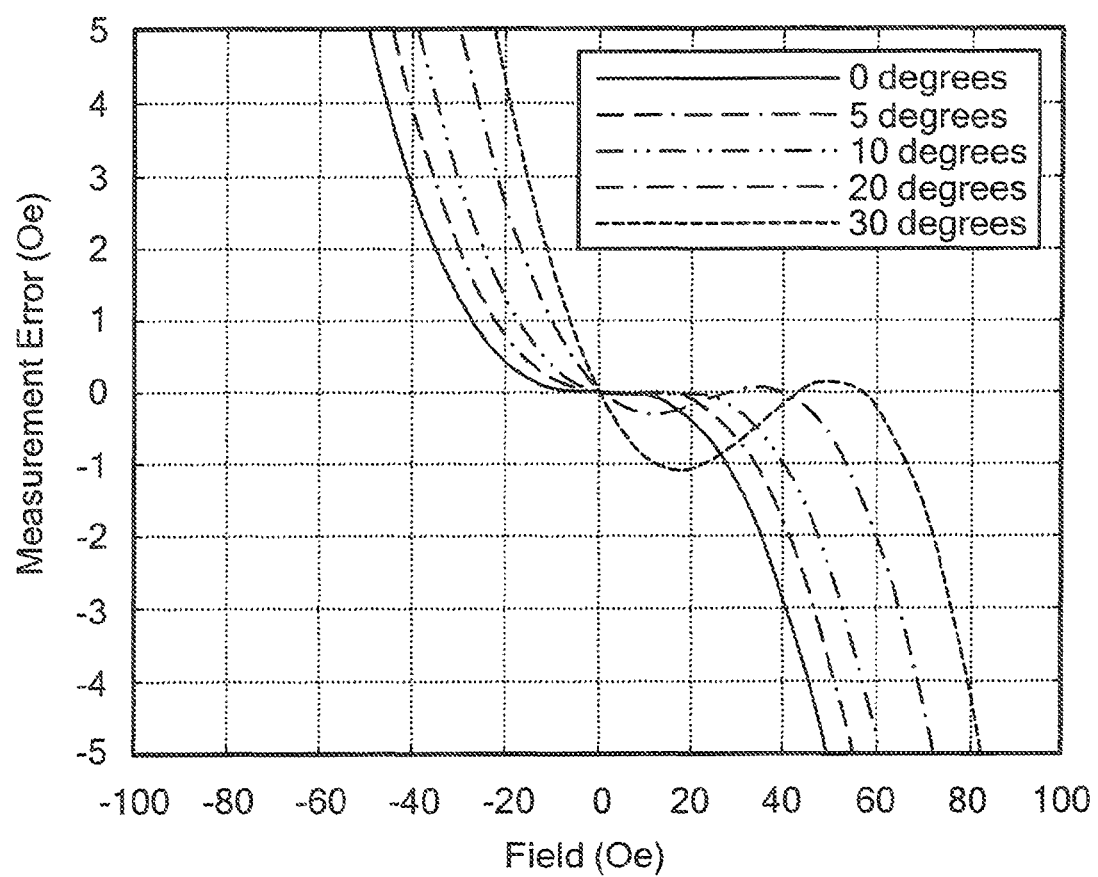
FIG. 5B is a graphical representation of sensor output voltage $V_o$ corresponding to error versus the applied field in accordance with embodiments of the invention.

FIG. 5B shows the error for a sensor having an applied field at an offset angle. If one desires to keep the error to around less than 1 Oe, then looking at the curve for offset angle θ=30 degrees, then field can vary from about −5 Oe to about +65 Oe. The enhanced unidirectional linearity is readily apparent as compared with conventional sensors having no offset in the applied field. Signal-to-Noise Ratio (SNR) is improved by enhancing linearity to provide a larger range for the same sensitivity. It is understood that maximum field strength shown as 100 Oe is illustrative and any practical field strength can be used.

It should be noted that while linearity is enhanced in one direction, linearity in the opposite direction decreases—bottom left in the illustrative graph of FIG. 5A. Thus, in an illustrative embodiment, one GMR element or bridge provides a unidirectional sensor having enhanced linearity. In another embodiment, a bidirectional sensor includes multiple sensor elements or bridges, one for each direction, to cause the applied field to be angled differently (180−2*theta from theta) on the second sensor or to have $H_p$ be about 180 degrees different.

FIG. 6A shows a portion of a current sensor 600 having two sensors at 602c and two sensors at 602d in a bridge configuration, such as the bridge of FIG. 1A, placed on a shaped conductor 604, which can be integrated into an IC package or external to the sensor. The two sensors at 602c are in the first and third positions in the bridge, and the two sensors at 602d are in the second and fourth positions in the bridge. The sensors at 602c,d have an applied field at offset angle θ, as shown more clearly in FIG. 6B. Two sensors in the bridge see a field in one direction, and the other two see a field in the opposite direction, allowing for differential measurement of the current through the conductor 604. Placing the elements at 602c,d provides a uni-directional current sensor with enhanced linearity due to the applied angle at offset angle θ. In a conventional configuration, sensors are at locations 602a,b.

As shown in FIG. 6C, additional GMR sensors on one device can be provided on a shaped conductor 640. The sensors can be selectively used to meet the needs of a particular application, such as bidirectional current sensing. A first GMR bridge can sense current in one direction and a second GMR bridge can sense current in the opposite direction. Pairs of sensor elements in respective bridges can be placed at locations 650, 652, 654, 656. One bridge can be used to detect current in a first direction and a second bridge can be used to detect current in a second direction opposite to the first direction.

In the illustrated embodiment, unidirectional current sensing in the direction indicated by arrow is provided by two sensors at location 652, where the sensors are diagonal from each other in the bridge, and two sensors at location 654. Unidirectional current sensing in the opposite direction of the arrow can be provided by two sensors at location 650 (diagonal from each other in the bridge), and two sensors at location 656 (diagonal from each other in the bridge).

Figure 4B:
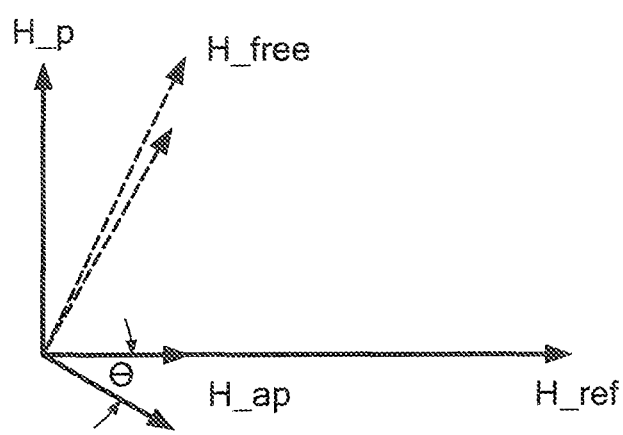

It should be noted that for the illustrated embodiment, the reference field H_ref and pinning field H_p are oriented as in FIG. 4. Thus, the GMR elements at the locations in FIG. 6C have the same pinning. This configuration is the simplest for having all elements on the same die. In addition, the same pinning allows for switching between the two unidirectional bridges for sensing bidirectionally with more linearity. In other embodiments, other field configurations can be used.

The bridges can be selectively turned on and off at a selected threshold. In embodiments, current direction can be sensed from a polarity (plus/minus) of the bridge voltage, which can be used to selectively activate one of the bridges. For multiple bridges, the output of a pre-amplifier can be positive or negative.

In embodiments, further pairs of sensor elements can be placed at locations 658, 660 on a non-arcuate portion of the shaped conductor 640 in a conventional manner.

It is understood that any practical number of GMR sensors can be used at various locations on a conductor to provide multi-directional current sensing and/or granularity. The sensors can be selectively used to measure the desired parameter. In addition, the conductor can be shaped as needed to obtain the desired offset angle. In one embodiment, a bidirectional sensor uses offset angles of plus and minus the same angle, so two unidirectional sensors in either direction can be used. In other embodiments, a GMR sensor with $H_p$ 180 degrees different can be used. In further embodiments, the die is rotated 180 degrees in order to create a unidirectional sensor in the opposite direction.

Figure 7:
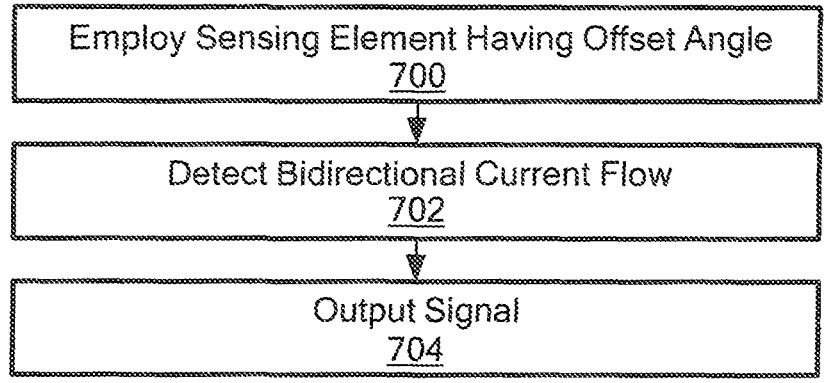
FIG. 7 is a flow diagram showing an illustrative sequence of steps for providing sensor output linearization according to an embodiment.

FIG. 7 shows an illustrative process for enhancing linearity of a sensor in accordance with illustrative embodiments of the invention. Step 700 employs a magnetoresistive magnetic field sensing element positioned with respect to a shaped conductor such that an applied field generated by current through the shaped conductor forms an offset angle theta defined by the applied field and a field of a pinning layer of the magnetoresistive element. In embodiments, the offset angle theta is greater than about five degrees to increase a linearity of an output of the magnetoresistive magnetic field sensing element for current in the shaped conductor flowing in a first direction. In optional step 702, one or more magnetic field sensing elements are used to detect birectional current flows in the shaped conductor. Step 704 employs an output module to receive the linearized signal and provide a device output signal.

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied in an application specific integrated circuit (ASIC), which can be an analog ASIC or a digital ASIC. In some embodiments, the "processor" can be embodied in a microprocessor with associated program memory. In some embodiments, the "processor" can be embodied in a discrete electronic circuit, which can be an analog or digital.

While magnetic field sensing elements are illustrated herein as GMR sensors, those skilled in the art will recognize that the principles described herein may be applicable to other types of magnetic field sensing elements.

Figure 8:
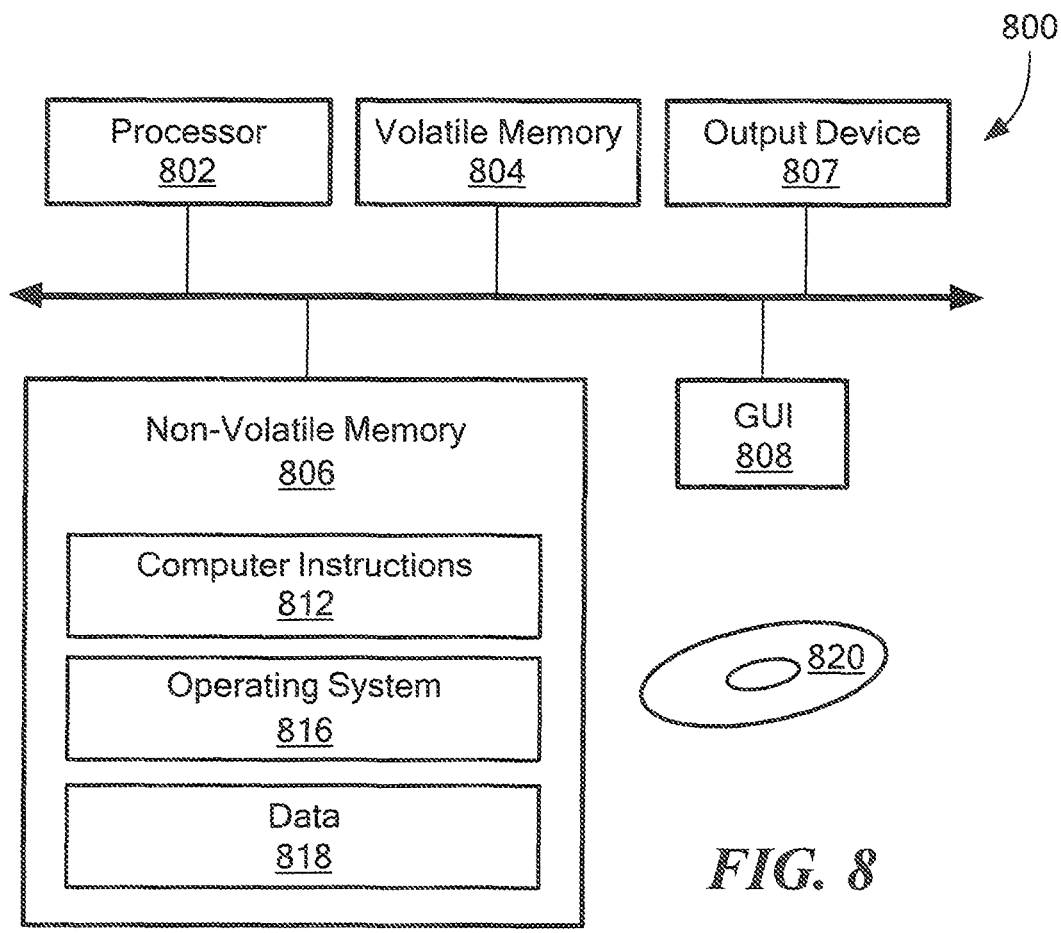
FIG. 8 is a schematic representation of an illustrative computer that can perform at least a portion of the processing described herein.

FIG. 8 shows an exemplary computer 800 that can perform at least part of the processing described herein. The computer 800 includes a processor 802, a volatile memory 804, a non-volatile memory 806 (e.g., hard disk), an output device 807 and a graphical user interface (GUI) 808 (e.g., a mouse, a keyboard, a display, for example). The non-volatile memory 806 stores computer instructions 812, an operating system 816 and data 818. In one example, the computer instructions 812 are executed by the processor 802 out of volatile memory 804. In one embodiment, an article 820 comprises non-transitory computer-readable instructions.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as, special purpose logic circuitry (e.g., an FPGA (field programmable gate array) and/or an ASIC (application-specific integrated circuit)).

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

What is claimed is:

1. A device, comprising:
a first magnetoresistive magnetic field sensing element positioned with respect to a shaped conductor such that an applied field generated by current through the shaped conductor forms an offset angle theta defined by the applied field and a field of a pinning layer of the first magnetoresistive magnetic field sensing element, wherein the offset angle theta is greater than about five degrees to increase a linearity of an output of the first magnetoresistive magnetic field sensing element for current in the shaped conductor flowing in a first direction; and
an output module to receive the linearized signal and provide a device output signal.

2. The device according to claim 1, wherein the first magnetoresistive magnetic field sensing element comprises a GMR element.

3. The device according to claim 2, wherein the GMR element comprises a second pinned layer providing a reference field substantially perpendicular to the field of the first pinned layer.

4. The device according to claim 1, wherein the first magnetoresistive magnetic field sensing element comprises a magnetoresistive element selected from a group consisting of a semiconductor magnetoresistive element, a giant magnetoresistive (GMR) element, an anisotropic magnetoresistive element (AMR), a tunneling magnetoresistive (TMR) element, and a magnetic tunnel junction (MTJ).

5. The device according to claim 1, wherein the first magnetoresistive magnetic field sensing element comprises magnetic sensors arranged in a Wheatstone bridge configuration.

6. The device according to claim 5, wherein first and second ones of the magnetic sensors are magnetically shielded for linear field sensing.

7. The device according to claim 1, wherein a supply voltage controls a gain of the magnetic field sensing element over temperature.

8. The device according to claim 1, wherein the shaped conductor comprises an arcuate portion coupled at each end to respective linear portions.

9. The device according to claim 8, wherein the first magnetoresistive magnetic field sensing element comprises elements in a bridge configuration such that the elements in the bridge configuration are positioned on the arcuate portion of the shaped conductor.

10. The device according to claim 9, wherein a direction of current flow in the shaped conductor is determined in the bridge configuration.

11. The device according to claim 1, further including a second magnetoresistive magnetic field sensing element to increase linearity of the output for current flow in the shaped conductor in the opposite direction.

12. The device according to claim 11, wherein an applied angle for the second magnetoresistive magnetic field sensing element is about equal to 180 minus theta, where theta is the applied angle for the first magnetoresistive magnetic field sensing element.

13. The device according to claim 11, wherein the first magnetoresistive magnetic field sensing element has a die orientation 180 degrees to the second magnetoresistive magnetic field sensing element.

14. A device, comprising:
a magnetic field sensor means for sensing current in a shaped conductor at an offset angle theta defined by the applied field and a field of a pinning layer of the first magnetic field sensor means, wherein the offset angle theta is greater than about five degrees to increase a linearity of an output of the first magnetic field sensor means for current in the shaped conductor flowing in a first direction; and
an output module to receive the linearized signal and provide a device output signal.

15. The device according to claim 14, further including a second magnetic field sensor means for increasing linearity of the output for current flow in the shaped conductor in the opposite direction.

16. The device according to claim 14, wherein the first magnetic field sensor means comprises a GMR element.

17. The device according to claim 16, wherein the GMR element comprises a second pinned layer providing a reference field substantially perpendicular to the field of the first pinned layer.

18. The device according to claim 14, wherein the first magnetic field sensor means comprises a magnetoresistive element selected from a group consisting of a semiconductor magnetoresistive element, a giant magnetoresistive (GMR) element, an anisotropic magnetoresistive element (AMR), a tunneling magnetoresistive (TMR) element, and a magnetic tunnel junction (MTJ).

19. The device according to claim 14, wherein the first magnetic field sensor means comprises magnetic sensors arranged in a Wheatstone bridge configuration.

20. The device according to claim 19, wherein a direction of current flow in the shaped conductor is determined in the bridge configuration.

21. A method, comprising:
positioning a first magnetoresistive magnetic field sensing element with respect to a shaped conductor such that an applied field generated by current through the shaped conductor forms an offset angle theta defined by the applied field and a field of a pinning layer of the first magnetoresistive magnetic field sensing element, wherein the offset angle theta is greater than about five degrees to increase a linearity of an output of the first magnetoresistive magnetic field sensing element for current in the shaped conductor flowing in a first direction; and
employing an output module to receive the linearized signal and provide a device output signal.

22. The method according to claim 21, further including positioning a second magnetoresistive magnetic field sensing element to increase linearity of the output for current flow in the shaped conductor in the opposite direction.

23. The method according to claim 21, wherein the first magnetoresistive magnetic field sensing element comprises a GMR element.

24. The method according to claim 21, wherein the first magnetoresistive magnetic field sensing element comprises a magnetoresistive element selected from a group consisting of a semiconductor magnetoresistive element, a giant magnetoresistive (GMR) element, an anisotropic magnetoresistive element (AMR), a tunneling magnetoresistive (TMR) element, and a magnetic tunnel junction (MTJ).

25. The method according to claim 21, wherein the first magnetoresistive magnetic field sensing element comprises magnetic sensors arranged in a Wheatstone bridge configuration.

26. The method according to claim 21, further including determining a direction of current flow in the shaped conductor in a bridge configuration.

27. A device, comprising:
a first magnetoresistive magnetic field sensing element positioned with respect to a shaped conductor such that an applied field generated by current through the shaped conductor forms an offset angle theta defined by the applied field and a field of a first pinned layer of the first magnetoresistive magnetic field sensing element, wherein the offset angle theta is greater than about five degrees to increase a linearity of an output of the first magnetoresistive magnetic field sensing element for current in the shaped conductor flowing in a first direction, wherein the output of the first magnetoresistive magnetic field sensing element increases in linearity as the applied field changes in a first direction and decreases in linearity as the applied field changes in a second direction that is opposite to the first direction; and
an output module to receive the output of the first magnetoresistive magnetic field sensing element and provide a device output signal,
wherein the shaped conductor comprises an arcuate portion coupled at each end to respective linear portions, and wherein the first magnetoresistive magnetic field sensing element comprises elements in a bridge configuration such that at least some of the elements in the bridge configuration are positioned on the arcuate portion of the shaped conductor.

28. The device according to claim 27, wherein first magnetoresistive magnetic field sensing element comprises a TMR element.

29. The device according to claim 27, wherein the first magnetoresistive magnetic field sensing element comprises a second pinned layer providing a reference field substantially perpendicular to the field of the first pinned layer.

30. The device according to claim 27, wherein the first magnetoresistive magnetic field sensing element comprises magnetic sensors arranged in a Wheatstone bridge configuration.

31. The device according to claim 27, wherein a direction of current flow in the shaped conductor is determined in the bridge configuration.

32. The device according to claim 27, further including a second magnetoresistive magnetic field sensing element to increase linearity of the output for current flow in the shaped conductor in the opposite direction.

33. The device according to claim 32, wherein an applied angle for the second magnetoresistive magnetic field sensing element is about equal to 180 minus theta, where theta is the applied angle for the first magnetoresistive magnetic field sensing element.

34. The device according to claim 32, wherein the first magnetoresistive magnetic field sensing element has a die orientation 180 degrees to the second magnetoresistive magnetic field sensing element.

* * * * *

UNITED STATES PATENT AND TRADEMARK OFFICE
CERTIFICATE OF CORRECTION

PATENT NO.        : 9,753,098 B2
APPLICATION NO.   : 15/263842
DATED             : September 5, 2017
INVENTOR(S)       : Alexander Latham It is certified that error appears in the above-identified patent and that said Letters Patent is hereby corrected as shown below:

In the Specification

Column 3, Line 65, delete "$V_o$" and replace with --$V_{out}$--.

Column 4, Line 2, delete "$V_o$" and replace with --$V_{out}$--.

Column 4, Line 8, delete "$V_o$" and replace with --$V_{out}$--.

Column 4, Line 13, delete "$V_o$" and replace with --$V_{out}$--.

Column 5, Line 41, delete "V" and replace with --$V_{cc}$--.

Column 6, Line 57, delete "$H_f$" and replace with --$H_{ref}$--.

Column 8, Line 60, delete "birectional" and replace with --bidirectional--.

In the Claims

Column 10, Line 10, delete the text beginning with "1. A device, comprising:" to and ending "provide a device output signal." in Line 23, and replace with the following claim:
--1. A device, comprising:
    a first magnetoresistive magnetic field sensing element positioned with respect to a shaped conductor such that an applied field generated by current through the shaped conductor forms an offset angle theta defined by the applied field and a field of a first pinned layer of the first magnetoresistive magnetic field sensing element, wherein the offset angle theta is greater than about five degrees to increase a linearity of an output of the first magnetoresistive magnetic field sensing element for current in the shaped conductor flowing in a first direction, wherein the output of the first magnetoresistive magnetic field sensing element increases in linearity as the applied field changes in a first direction and decreases in linearity as the applied field changes in a second direction that is opposite to the first direction; and Signed and Sealed this
Second Day of April, 2019

Andrei Iancu
*Director of the United States Patent and Trademark Office*

CERTIFICATE OF CORRECTION (continued)
U.S. Pat. No. 9,753,098 B2 an output module to receive the linearized output of the first magnetoresistive magnetic field sensing element and provide a device output signal.--.

Column 11, Line 5, delete the text beginning with "14. A device, comprising:" to and ending "provide a device output signal." in Line 15, and replace with the following claim:
--14. A device, comprising:
a first magnetic field sensor means for sensing current in a shaped conductor at an offset angle theta defined by an applied field and a field of a first pinned layer of the first magnetic field sensor means, wherein the offset angle theta is greater than about five degrees to increase a linearity of an output of the first magnetic field sensor means for current in the shaped conductor flowing in a first direction, wherein the output of the first magnetic field sensor means increases in linearity as the applied field changes in a first direction and decreases in linearity as the applied field changes in a second direction that is opposite to the first direction; and
an output module to receive an output of the first magnetic field sensor means and provide a device output signal.--.

Column 11, Line 39, delete the text beginning with "21. A method, comprising:" to and ending "signal and provide a device output signal." in Line 52, and replace with the following claim:
--21. A method, comprising:
positioning a first magnetoresistive magnetic field sensing element with respect to a shaped conductor such that an applied field generated by current through the shaped conductor forms an offset angle theta defined by the applied field and a field of a pinning layer of the first magnetoresistive magnetic field sensing element, wherein the offset angle theta is greater than about five degrees to increase a linearity of an output of the first magnetoresistive magnetic field sensing element for current in the shaped conductor flowing in a first direction, wherein the output of the first magnetoresistive magnetic field sensing element increases in linearity as the applied field changes in a first direction and decreases in linearity as the applied field changes in a second direction that is opposite to the first direction; and
employing an output module to receive the output of the first magnetoresistive magnetic field sensing element and provide a device output signal.--.